(12) United States Patent
Mahoney

(10) Patent No.: US 12,295,120 B2
(45) Date of Patent: May 6, 2025

(54) HEAT TRANSFER DEVICE PROVIDING HEAT TRANSFER FROM COMPONENTS ON TRANSVERSELY ORIENTED CIRCUIT BOARDS

(71) Applicant: Applied Optoelectronics, Inc., Sugar Land, TX (US)

(72) Inventor: William G. Mahoney, Suwanee, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 296 days.

(21) Appl. No.: 17/888,892

(22) Filed: Aug. 16, 2022

(65) Prior Publication Data
US 2024/0064939 A1 Feb. 22, 2024

(51) Int. Cl.
*H05K 7/20* (2006.01)
*H05K 1/14* (2006.01)
(Continued)

(52) U.S. Cl.
CPC ............ *H05K 7/2039* (2013.01); *H05K 1/14* (2013.01); *H05K 5/0026* (2013.01)

(58) Field of Classification Search
CPC ...... H05K 7/2039; H05K 1/14; H05K 5/0026; H05K 3/366; G02B 6/4246; G02B 6/428; G02B 6/4266–4273; H04B 10/40
See application file for complete search history.

(56) References Cited

U.S. PATENT DOCUMENTS 5,973,923 A * 10/1999 Jitaru ............... H01F 27/06
361/740
7,652,358 B2 * 1/2010 Minakawa ........... H05K 1/14
361/783
(Continued)

FOREIGN PATENT DOCUMENTS

JP 2009182196 A * 8/2009

OTHER PUBLICATIONS

Ota Arinobu; Honjo Noboru; Umetsu Norio, "Heat Dissipation Member and Semiconductor Device", Aug. 13, 2009, Onkyo KK, Entire Document (Translation of JP 2009182196). (Year: 2009).*

*Primary Examiner* — Stephen S Sul
(74) *Attorney, Agent, or Firm* — Grossman Tucker Perreault & Pfleger, PLLC; Norman S. Kinsella

(57) ABSTRACT

A heat transfer device may be used to provide a thermal conduit from heat generating components mounted on transversely oriented circuit boards. The heat transfer device generally includes a base portion for supporting and thermally coupling with at least one heat generating component on a main circuit board and a transverse portion for supporting and thermally coupling with at least one heat generating component on a daughter circuit board that is oriented transverse to the main circuit board. The base and transverse portions may be made of a thermally conductive material with raised pedestals providing the thermal coupling with the heat generating components. The transverse portion of the heat transfer device may also be designed to facilitate connecting the daughter circuit board to the main circuit board. The heat transfer device may be used in an opto-electronic communications module, such as a broadband digital access (BDA) module used in a hybrid fiber-coaxial (HFC) network.

21 Claims, 6 Drawing Sheets

(51) Int. Cl.
   *H05K 5/00*   (2006.01)
   *H05K 7/14*   (2006.01)

(56) References Cited

U.S. PATENT DOCUMENTS

| | | | | |
|---|---|---|---|---|
| 9,983,370 | B1* | 5/2018 | Mahoney | G02B 6/4269 |
| 10,098,221 | B2 | 10/2018 | Celedon et al. | |
| 10,353,163 | B1* | 7/2019 | Hanks | G02B 6/4448 |
| 2012/0293963 | A1* | 11/2012 | Slaton | H05K 1/0206 |
| | | | | 361/720 |
| 2015/0098192 | A1* | 4/2015 | Washeleski | H05K 1/0206 |
| | | | | 361/714 |
| 2016/0029512 | A1* | 1/2016 | Ady | G06F 1/203 |
| | | | | 361/704 |
| 2018/0092199 | A1* | 3/2018 | Celedon | H05K 1/18 |
| 2019/0273331 | A1* | 9/2019 | Mahoney | H01R 24/40 |
| 2021/0112679 | A1* | 4/2021 | Liu | H05K 7/20418 |

* cited by examiner

HEAT TRANSFER DEVICE PROVIDING HEAT TRANSFER FROM COMPONENTS ON TRANSVERSELY ORIENTED CIRCUIT BOARDS

TECHNICAL FIELD

The present disclosure relates to heat transfer in optoelectronic and electronic devices and more particularly, to a heat transfer device providing heat transfer from components mounted on transversely oriented circuit boards.

BACKGROUND INFORMATION

Excessive heat can adversely impact the performance of an electronic device such as an optoelectronic device. Thermal management within an enclosure of an electronic device is often a challenge, however, especially given performance demands and electrical and mechanical design constraints. These design constraints and limited space within an enclosure may require the circuit boards with heat generating components to be oriented in a way that makes effective heat transfer more difficult.

A remote optical node in a hybrid fiber-coaxial (HFC) network, such as a CATV network, is one example of an optoelectronic device that presents a unique challenge with thermal management. In a CATV/HFC network, additional modules are being designed for the optical nodes to provide digital communication between a headend/hub and the optical node, referred to as broadband digital access (BDA). One example of a BDA module designed for an optical node to provide an all-digital link between the headend/hub in a CATV/HFC network and the optical node is described, for example, in pending U.S. provisional patent application Ser. No. 63/253,842, which is commonly owned and incorporated herein by reference. These additional modules generate additional heat and further reduce the already limited space inside the housing of the optical node. The modules may include, among other things, an optical transmitter or transceiver module, such as a small form-factor pluggable (SFP) module, with one or more lasers that may not perform properly at high temperatures. Because of the location of the laser(s) in the optical transmitter or transceiver, the desired orientation of the transceivers in the optical node housing, and the limited space in the optical node housing, effectively transferring the heat from the transceivers, as well as from other components in the optical node, is particularly challenging.

SUMMARY

According to one aspect of the present disclosure, a heat transfer device includes a base portion extending in a first plane and a transverse portion extending from the base portion in a second plane transverse to the first plane. The base portion is configured to support a main circuit board and includes at least one base pedestal configured to thermally couple to at least one heat generating component on the main circuit board. The transverse portion is configured to support a daughter circuit board transverse to the main circuit board and includes at least one transverse pedestal configured to thermally couple to at least one heat generating component on the daughter circuit board.

According to another aspect of the present disclosure, an opto-electronic communication module includes a heat transfer device including a base portion extending in a first plane and a transverse portion extending in a second plane transverse to the first plane. The base portion includes at least a one base pedestal and the transverse portion includes at least one transverse pedestal. The opto-electronic communications module also includes a main circuit board mounted to the base portion and a daughter circuit board mounted to the transverse portion. The main circuit board includes at least one heat generating component in thermal contact with the at least one base pedestal, and the daughter circuit board includes at least one heat generating component in thermal contact with the at least one transverse pedestal.

According to a further aspect of the present disclosure, an optical node is used in a hybrid fiber-coaxial (HFC) network. The optical node includes a housing and a broadband digital access (BDA) module disposed in the housing. The BDA module is configured to provide optical and electrical communications between a headend/hub and subscriber locations in the HFC network. The BDA module includes a heat transfer device including a base portion extending in a first plane and a transverse portion extending in a second plane transverse to the first plane. The base portion includes at least a one base pedestal and the transverse portion includes at least one transverse pedestal. The base portion is thermally coupled to the housing such that heat is transferred from the base portion to the housing. A main circuit board is mounted to the base portion and includes at least one heat generating component in thermal contact with the at least one base pedestal such that heat is transferred from the heat generating component on the main circuit board to the housing via the base portion of the heat transfer device. A daughter circuit board is mounted to the transverse portion and includes at least one heat generating component in thermal contact with the at least one transverse pedestal such that heat is transferred from the heat generating component on the daughter circuit board to the housing via the transverse portion and the base portion of the heat transfer device.

BRIEF DESCRIPTION OF THE DRAWINGS

These and other features and advantages will be better understood by reading the following detailed description, taken together with the drawings wherein.

DETAILED DESCRIPTION

Figure 1:
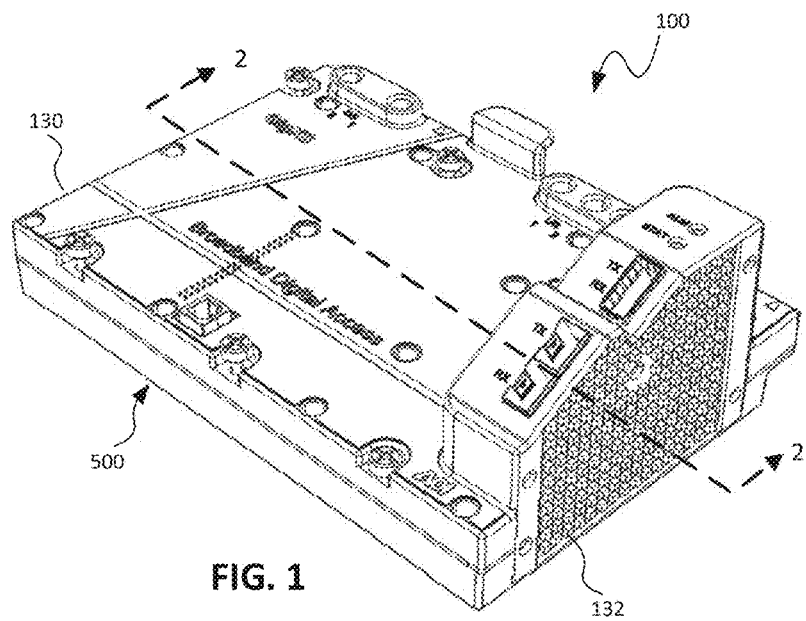
FIG. 1 is a perspective view of an opto-electronic communications module including a heat transfer device providing heat transfer from components on circuit boards with a transverse orientation, consistent with embodiments of the present disclosure.

A heat transfer device, consistent with embodiments of the present disclosure, may be used to provide a thermal conduit from heat generating components mounted on transversely oriented circuit boards. The heat transfer device generally includes a base portion for supporting and thermally coupling with at least one heat generating component on a main circuit board and a transverse portion for supporting and thermally coupling with at least one heat generating component on a daughter circuit board that is oriented transverse to the main circuit board. The base and transverse portions of the heat transfer device may be made of a thermally conductive material with raised pedestals providing the thermal coupling with the heat generating components. The transverse portion of the heat transfer device may also be designed to facilitate connecting the daughter circuit board to the main circuit board. The heat transfer device may be used in an opto-electronic communications module, such as a broadband digital access (BDA) module used in a hybrid fiber-coaxial (HFC) network that delivers CATV services, where the design constraints require the transverse orientation of the circuit boards. Heat transfer and thermal management is especially challenging in a BDA module that provides increased bandwidth at higher frequencies and where high temperatures can affect the performance.

The heat transfer device described herein thus allows heat to be transferred from the heat generating components and away from the circuit boards, for example, using direct conduction and without using forced air. When installed in an opto-electronic communications module, the heat transfer device may be thermally coupled to a housing of the opto-electronic communications module to allow the heat to be transferred to the housing, for example, to heat transfer fins located on the outside of the housing, for heat dissipation. The heat transfer device, consistent with embodiments of the present disclosure, thus provides heat transfer more effectively along a more direct path away from the heat generating components while allowing the components and circuit boards to be mounted with the desired orientation inside a node housing.

Referring to FIGS. 1-4, an opto-electronic communications module 100 includes a heat transfer device 500, consistent with an embodiment of the present disclosure, providing heat transfer from components on transversely oriented circuit boards 110, 120, such as printed circuit boards (PCBs). The opto-electronics communications module 100 may be a broadband digital access (BDA) module that provides optical and electrical communications in a hybrid fiber-coaxial (HFC) network that delivers CATV services from a headend/hub to subscriber locations (not shown), for example, as described below in connection with FIGS. 9 and 10. Although an embodiment is shown and described, other embodiments of the heat transfer device may be used in any type of opto-electronic or electronic modules where heat transfer is desired from heat generating components on transversely oriented circuit boards.

Figure 2:
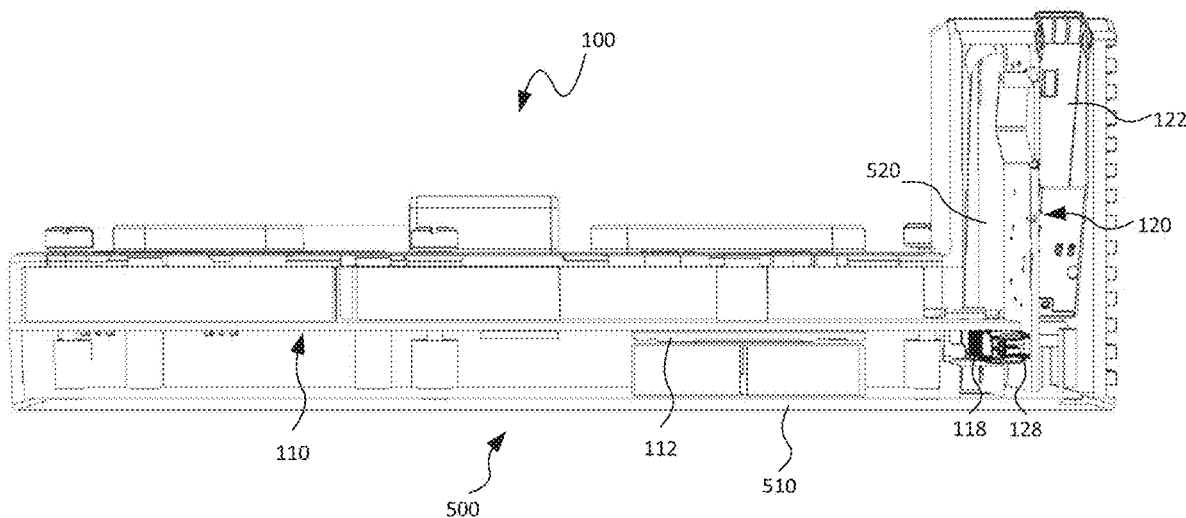
FIG. 2 is a cross-sectional view of the opto-electronic communications module in FIG. 1 taken along line 2-2.
Figure 3:
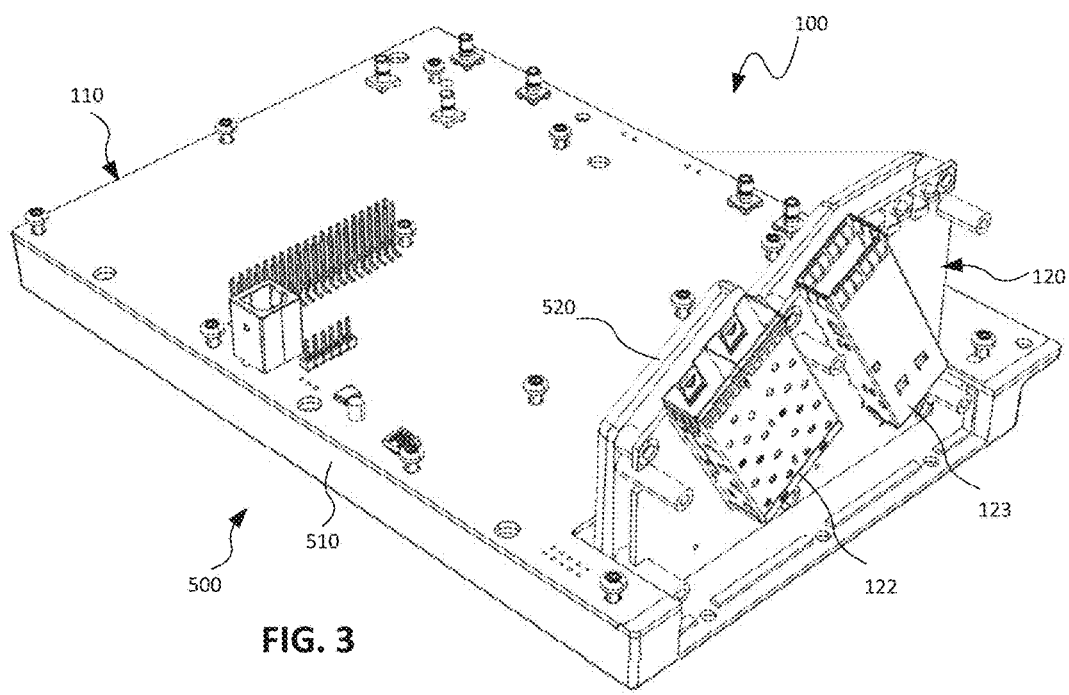
FIG. 3 is a perspective view of the opto-electronic communications module shown in FIG. 1 with the cover removed.
Figure 4:
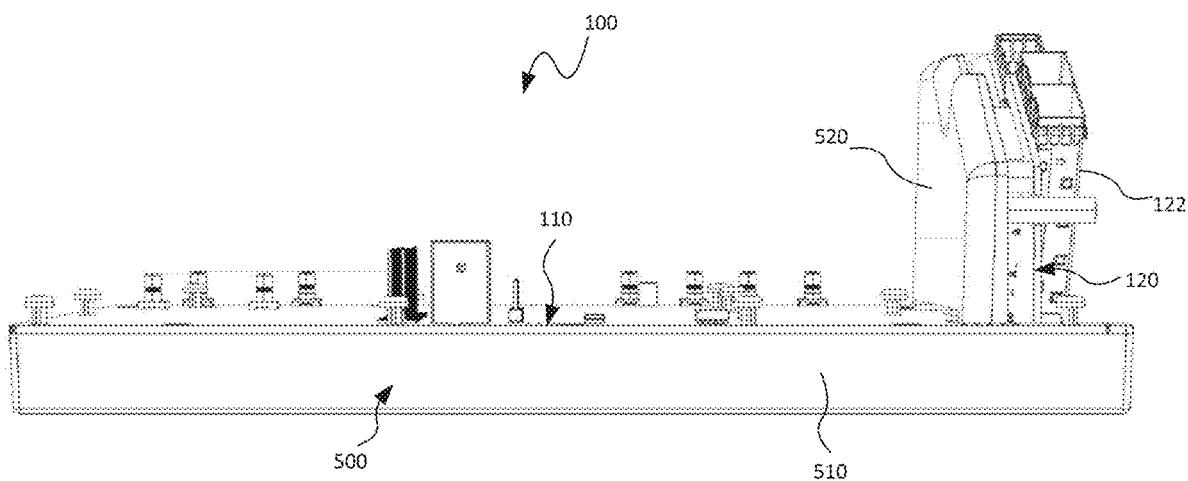
FIG. 4 is a side view of the opto-electronic communications module shown in FIG. 3.
Figure 5:
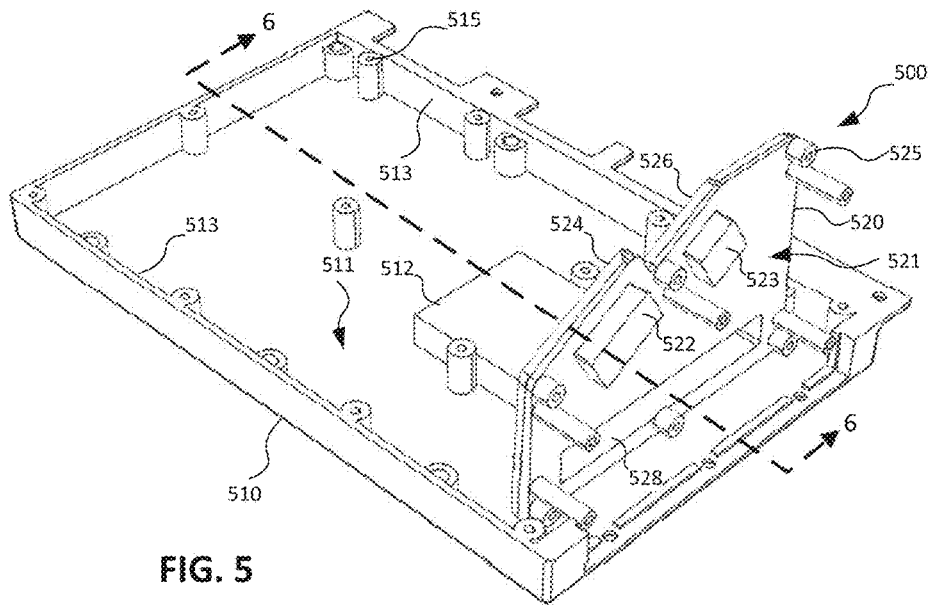
FIG. 5 is a perspective view of an embodiment of a heat transfer device that may be used in the opto-electronic communications module, consistent with the present disclosure.
Figure 6:
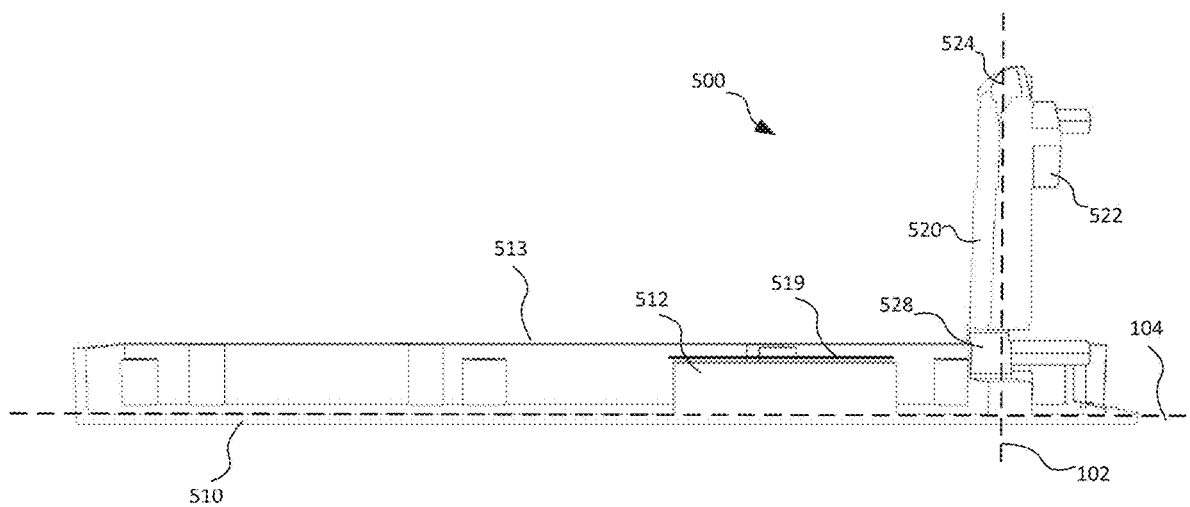
FIG. 6 is a side cross-sectional view of the heat transfer device shown in FIG. 5 taken along line 6-6.
Figure 7:
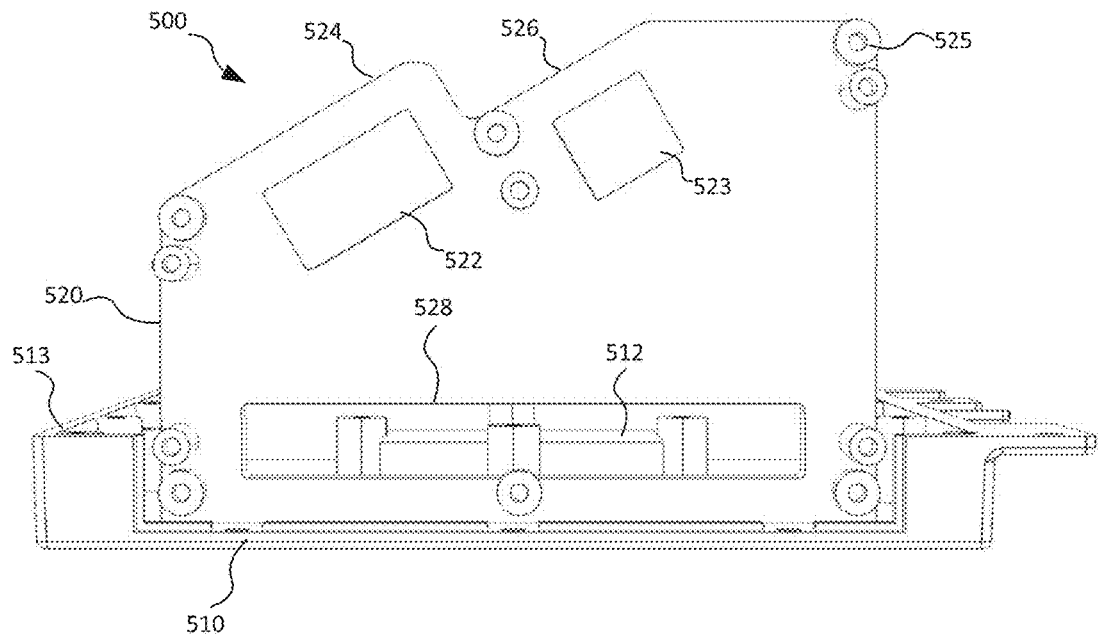
FIG. 7 is a side view of the heat transfer device shown in FIG. 5.
Figure 8:
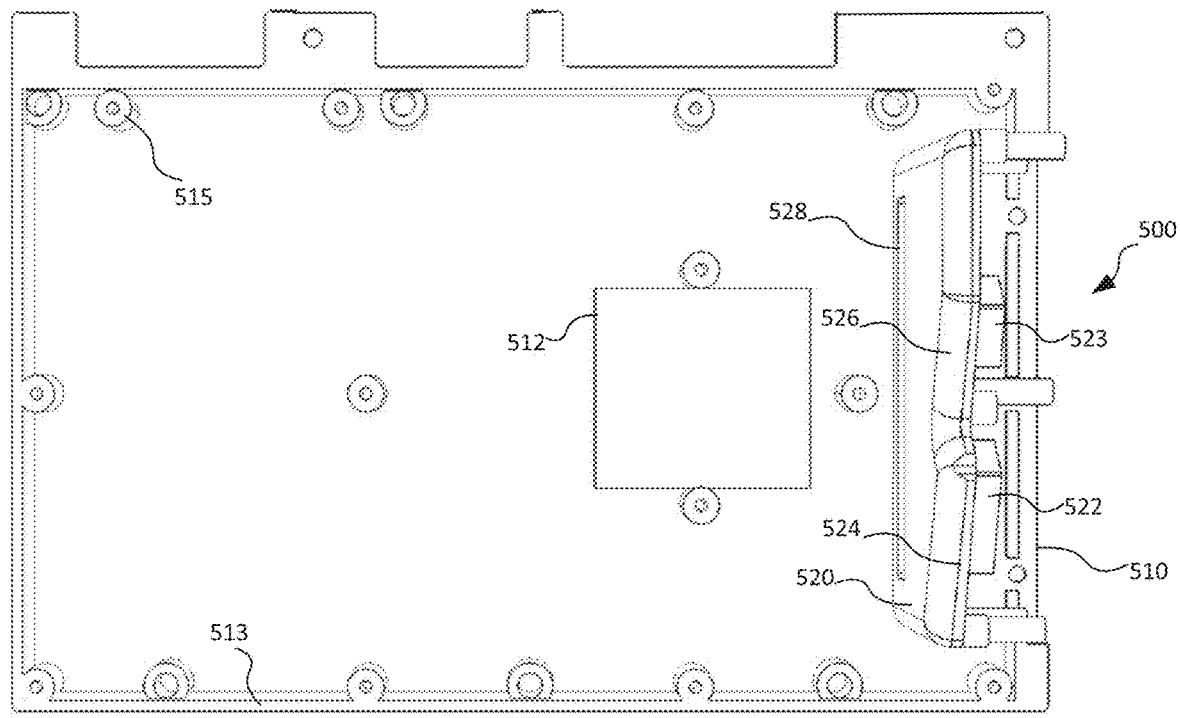
FIG. 8 is a top plan view of the heat transfer device shown in FIG. 5.

In general, the opto-electronic communications module 100 includes a main circuit board 110 (e.g., a main PCB) and a daughter circuit board 120 (e.g., a daughter PCB) oriented in first and second transverse planes 102, 104. Although the illustrated embodiment shows the circuit boards 110, 120 oriented orthogonally, other transverse orientations are within the scope of the present disclosure. As shown in FIG. 2, the daughter circuit board 120 is connected to the main circuit board 110, for example, with mating connectors 118, 128 through the heat transfer device 500.

The heat transfer device 500 includes a base portion 510 that supports and transfers heat from components on the main circuit board 110 and a transverse portion 520 that supports and transfers heat from components on the daughter circuit board 120. The module 100 may include a top cover 130 over the main circuit board 110 supported on the base portion 510 and a side cover 132 over the daughter circuit board 120 supported on the transverse portion 520. The side cover 132 may include holes to allow air flow.

In the illustrated embodiment, the main circuit board 110 includes at least one heat generating component 112, such as a field programmable gate array (FPGA) component or other type of integrated circuit component, mounted on a bottom side of the main circuit board 110 and thermally coupled to the base portion 510 of the heat transfer device 500. The daughter circuit board 120 includes one or more heat generating components 122, 123, such as one or more optical transceivers, mounted on a side of the daughter circuit board 120 and thermally coupled to the transverse portion 520 of the heat transfer device. In a BDA module, for example, two small-form factor pluggable (SFP) optical transceiver modules are mounted to the daughter circuit board 120 and thermally coupled to the transverse portion 520 of the heat transfer device. As used herein small form-factor pluggable refers to the small-form factor pluggable (SFP) specification and any variations or versions thereof including, without limitation, SFP+, XFP, CFP and QSFP. SFP optical transceiver modules include lasers (not shown) for generating and transmitting optical signals. As shown, the transceivers may be mounted at an angle to facilitate receiving optical connectors with fibers maintaining a desired fiber bend radius. Other electronic and/or optoelectronic components, such as microprocessors and/or memory chips, may also be mounted to the circuit boards 110, 120.

Referring to FIGS. 5-8, an embodiment of the heat transfer device 500 is shown and described in greater detail. The base portion 510 and the transverse portion 520 may be formed as one piece from a thermally conductive material, such as aluminum. In the illustrated embodiment, the base portion 510 is formed as a tray having a bottom surface 511 and sides 513. The transverse portion 520 may extend orthogonally from the bottom surface 511 of the base portion 510 and the main circuit board 110 may be supported on the sides 513. The base portion 510 and transverse portion 520 may include mounting structures 515, 525 for mounting the respective circuit boards 110, 120, for example, with screws. The base portion 510 and the transverse portion 520 are generally sized and shaped according to the application, for example, the electrical and mechanical design constraints in a node housing with limited space. Other shapes and orientations for the base portion and the transverse portion are contemplated depending on the application.

In this embodiment, the base portion 510 of the heat transfer device 500 includes a raised thermal pedestal 512 in thermal contact with at least a portion of the heat generating component 112 on the main circuit board 110. The transverse portion 520 of the heat transfer device 500 includes first and second raised thermal pedestals 522, 523 in thermal contact with at least a portion of the respective heat generating components 122, 123, such as optical transceivers, on the daughter circuit board 120. As used herein, "thermal contact" refers to direct or indirect contact sufficient to allow heat to be conducted. The base pedestal 512 is raised above a surface 511 of the base portion 510, and the transverse pedestals 522, 523 are raised from a surface 521 of the transverse portion 520. Although a certain number and location of thermal pedestals is shown, other embodiments of a heat transfer device may include other numbers and/or locations of pedestals depending on the desired number and location of components for heat transfer.

One or more of the pedestals 512, 522, 523 may also include a thermal medium or pad (e.g., pad 519 on base pedestal 512), such as a lithium grease or silicone-based pad, for example, to decrease rugosity or surface roughness and improve the heat transfer to the raised thermal pedestals. Other thermally conductive substances, materials or structures may also be used on the raised thermal pedestals 512, 522, 523 to improve heat transfer. The raised thermal pedestals 512, 522, 523 may also contact the components directly.

As shown, the transverse portion 520 includes one or more angled top edges 524, 526 and the thermal pedestals 522, 523 are angled to provide the desired orientation of the heat generating components, for example, optical transceivers angled to facilitate connections inside a housing with limited space. The transverse portion 520 further includes a passageway 528, for example, proximate the base portion 510 to allow the connection of the daughter circuit board 120 to the main circuit board 110. As shown in FIG. 2, for example, the one or more connectors 118, 128 of the main circuit board 110 and the daughter circuit board 120 connect through the passageway 528. A portion of the main circuit board 110 may also extend into the passageway 528 to allow the connection.

Figure 9:
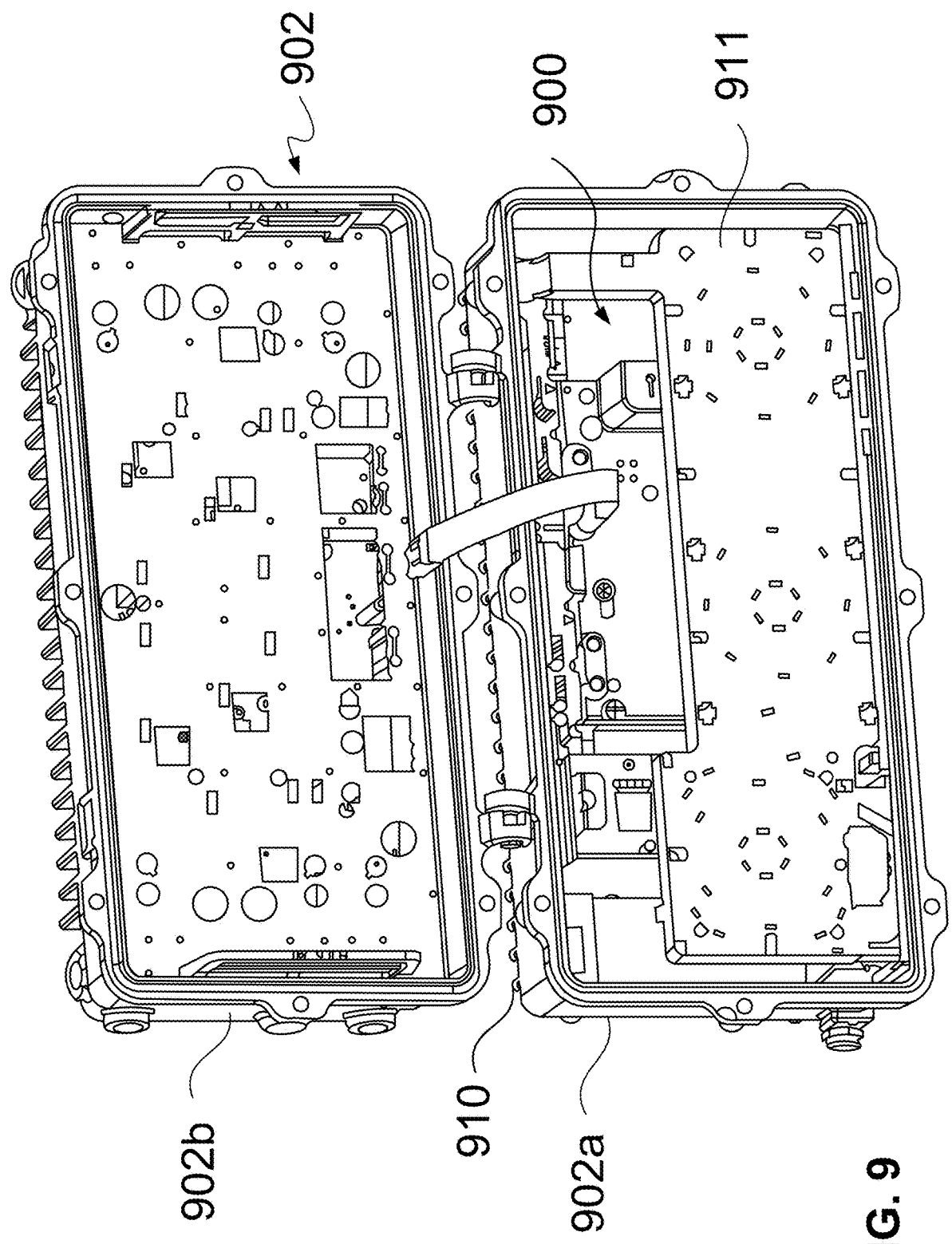
FIGS. 9 and 10 are top perspective views of a broadband digital access (BDA) module including a heat transfer device, consistent with embodiments of the present disclosure, positioned in an optical node of a hybrid fiber-coaxial network.
Figure 10:
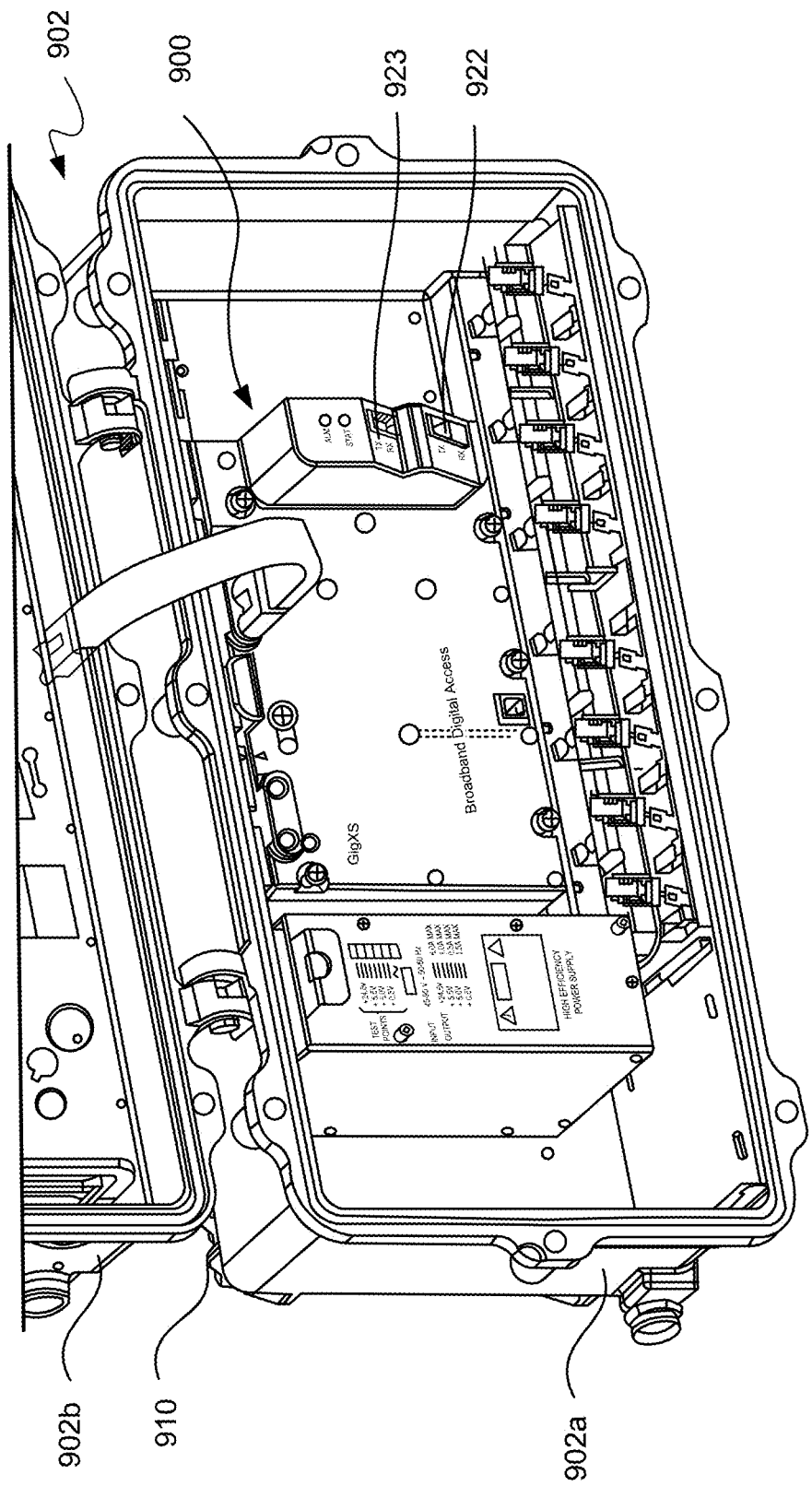

As shown in FIGS. 9 and 10, a BDA module 900 including a heat transfer device, as described above, may be located in a housing 902a, 902b of an optical node used in a CATV/HFC network. One example of a BDA module is described in greater detail in pending U.S. provisional patent application Ser. No. 63/253,842, which is commonly owned and incorporated herein by reference. The node housing 902 may have two housing sides 902a, 902b pivotably coupled at a hinge (e.g., in a clamshell configuration), and the BDA module 900 sits in one housing side 902a. The outside of the heat transfer device (not shown in FIGS. 9 and 10) is thermally coupled to the inside of the housing side 902a such that heat is transferred to heat transfer fins 910 on the outside of the housing side 902a.

Other circuit boards and/or structures 911, such as a fiber handling tray, may be positioned over the BDA module 900, as shown in FIG. 9, thereby limiting space within the housing 902. When such structures 911 are positioned over the BDA module 900, there is limited clearance between the structure 911 and the connectors 922, 923 on the transceivers mounted to the transversely oriented circuit boards. The angled positioning of the transceivers in the BDA module 900, as described above, allows optical connectors to be connected to the transceivers in this limited space without having to bend optical fibers more than the appropriate bend radius.

Accordingly, a heat transfer device, consistent with embodiments of the present disclosure, may be used to improve heat transfer from heat generating components on transversely oriented circuit boards within an electronic or optoelectronic device, such as opto-electronic communication modules within an optical node in an HFC network. The heat transfer may be improved by providing a more direct path for heat transfer from the heat generating region of the components within limited space.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A heat transfer device comprising:
   a base portion extending in a first plane and configured to support a main circuit board, the base portion including at least one base pedestal configured to thermally couple to at least one heat generating component on the main circuit board;
   a transverse portion extending from the base portion in a second plane transverse to the first plane and configured to support a daughter circuit board transverse to the main circuit board, the transverse portion including at least one transverse pedestal configured to thermally couple to at least one heat generating component on the daughter circuit board; and
   wherein the transverse portion further includes a passageway configured to receive at least one connector connecting the main circuit board and the daughter circuit board.

2. The heat transfer device of claim 1, wherein the transverse portion is substantially orthogonal to the base portion.

3. The heat transfer device of claim 1, wherein the base portion and the transverse portion are formed as one piece from a thermally conductive material.

4. The heat transfer device of claim 1, wherein the base portion and the transverse portion are formed as one piece from aluminum.

5. The heat transfer device of claim 1, wherein the at least one transverse pedestal includes a plurality of transverse pedestals.

6. The heat transfer device of claim 1, further comprising a thermal pad located on at least one of the at least one base pedestal and/or the at least one transverse pedestal.

7. The heat transfer device of claim 1, wherein the transverse portion includes at least one angled top edge.

8. The heat transfer device of claim 1, wherein the base portion is formed as a tray.

9. The heat transfer device of claim 1, wherein the passageway is closer to the base portion than the at least one transverse pedestal.

10. An opto-electronic communication module comprising:
    a heat transfer device including a base portion extending in a first plane and a transverse portion extending in a second plane transverse to the first plane, wherein the base portion includes at least a one base pedestal and wherein the transverse portion includes at least one transverse pedestal;
    a main circuit board mounted to the base portion, the main circuit board including at least one heat generating component in thermal contact with the at least one base pedestal;
    a daughter circuit board mounted to the transverse portion, the daughter circuit board including at least one heat generating component in thermal contact with the at least one transverse pedestal; and wherein the transverse portion includes a passageway, and wherein the main circuit board and the daughter circuit board are connected through the passageway.

11. The opto-electronic communication module of claim 10, wherein the transverse portion is substantially orthogonal to the base portion.

12. The opto-electronic communication module of claim 10, wherein the base portion and the transverse portion are formed as one piece from a thermally conductive material.

13. The opto-electronic communication module of claim 10, wherein the at least one heat generating component on the main circuit board includes an integrated circuit component.

14. The opto-electronic communication module of claim 10, wherein the at least one heat generating component on the daughter circuit board includes at least one optical transceiver.

15. The opto-electronic communication module of claim 14, wherein the transverse portion includes a top edge angled relative to the first plane, and wherein the at least one optical transceiver is mounted to the transverse portion angled relative to the first plane to facilitate connecting a cable to the optical transceiver.

16. The opto-electronic communication module of claim 10, wherein the at least one heat generating component on the daughter circuit board includes first and second optical transceivers.

17. The opto-electronic communication module of claim 10, wherein the main circuit board and the daughter circuit board are transversely oriented.

18. An optical node for use in a hybrid fiber-coaxial (HFC) network, the optical node comprising:
    a housing; and
    a broadband digital access (BDA) module disposed in the housing, the BDA module being configured to provide optical and electrical communications between a head-end/hub and subscriber locations in the HFC network, the BDA module including:
        a heat transfer device including a base portion extending in a first plane and a transverse portion extending in a second plane transverse to the first plane, wherein the base portion includes at least a one base pedestal and wherein the transverse portion includes at least one transverse pedestal, and wherein the base portion is thermally coupled to the housing such that heat is transferred from the base portion to the housing;
        a main circuit board mounted to the base portion, the main circuit board including at least one heat generating component in thermal contact with the at least one base pedestal such that heat is transferred from the at least one heat generating component on the main circuit board to the housing via the base portion of the heat transfer device;
        a daughter circuit board mounted to the transverse portion, the daughter circuit board including at least one heat generating component in thermal contact with the at least one transverse pedestal such that heat is transferred from the at least one heat generating component on the daughter circuit board to the housing via the transverse portion and the base portion of the heat transfer device; and
        wherein the transverse portion includes a passageway, and wherein the main circuit board and the daughter circuit board are connected through the passageway.

19. The optical node of claim 18, wherein the at least one heat generating component on the daughter circuit board includes at least first and second optical transceivers.

20. The optical node of claim 18, wherein the at least one heat generating component on the main circuit board includes an integrated circuit component.

21. The optical node of claim 18, wherein the main circuit board and the daughter circuit board are transversely oriented.

* * * * *